(12) United States Patent
Mulaosmanovic et al.

(10) Patent No.: US 10,963,776 B2
(45) Date of Patent: Mar. 30, 2021

(54) ARTIFICIAL NEURON BASED ON FERROELECTRIC CIRCUIT ELEMENT

(71) Applicant: NaMLab gGmbH, Dresden (DE)

(72) Inventors: Halid Mulaosmanovic, Dresden (DE); Stefan Slesazeck, Arnsdorf (DE)

(73) Assignee: NaMLab gGmbH, Dresden (DE)

( * ) Notice: Subject to any disclaimer, the term of this patent is extended or adjusted under 35 U.S.C. 154(b) by 0 days.

(21) Appl. No.: 16/550,515

(22) Filed: Aug. 26, 2019

(65) Prior Publication Data

US 2020/0065647 A1 Feb. 27, 2020

Related U.S. Application Data

(60) Provisional application No. 62/722,532, filed on Aug. 24, 2018.

(51) Int. Cl.
*G11C 11/22* (2006.01)
*G06N 3/04* (2006.01)
*G06N 3/06* (2006.01)
*H01L 27/11502* (2017.01)
*G11C 11/54* (2006.01)

(52) U.S. Cl.
CPC .......... *G06N 3/04* (2013.01); *G06N 3/06* (2013.01); *G11C 11/221* (2013.01); *G11C 11/54* (2013.01); *H01L 27/11502* (2013.01)

(58) Field of Classification Search
CPC ...... G06N 3/04; G06N 3/06; H01L 27/11502; H01L 29/78; H01L 29/513; H01L 27/1159; H01L 29/78391; G11C 11/221; G11C 11/54; G11C 11/223
See application file for complete search history.

(56) References Cited

U.S. PATENT DOCUMENTS

| | | | | |
|---|---|---|---|---|
| 2004/0062075 | A1* | 4/2004 | Reohr | G11C 11/22 365/185.01 |
| 2004/0211994 | A1* | 10/2004 | Ueda | G11C 27/005 257/288 |
| 2008/0212359 | A1* | 9/2008 | Muraoka | H01L 45/1233 365/148 |
| 2018/0082729 | A1* | 3/2018 | Slesazeck | H01L 27/11507 |

(Continued)

OTHER PUBLICATIONS

Burr, G., et al., "Neuromorphic computing using non-volatile memory", Advances in Physics: X, 2:1, 89-124, DOI: 10.1080/23746149.2016.1259585, Dec. 4, 2016, 37 Pgs.

(Continued)

*Primary Examiner* — David Lam
(74) *Attorney, Agent, or Firm* — Dicke, Billig & Czaja, PLLC

(57) ABSTRACT

An artificial neuron integrated circuit including a polarizable circuit element having a first electrode, a second electrode, and a polarizable material layer disposed between the first and second electrodes, the polarizable material layer changeable between a first polarization state and a second polarization state, in response to receiving a number of voltage pulses across the first and second electrodes, the polarizable material layer to change from one of the first and second polarization states to the other of the first and second polarization states, where each of the number of voltage pulses individually is insufficient to change the polarization state.

31 Claims, 15 Drawing Sheets

(56) References Cited

U.S. PATENT DOCUMENTS

2018/0300626 A1* 10/2018 Lee .................. G06N 3/049

OTHER PUBLICATIONS

Indiveri, G., et al., "Neuromorphic silicon neuron circuits", www.frontiersin.org, May 2011, vol. 5, Article 73, 23 Pgs.
Ishiwara, H., "Proposal of Adaptive-Learning Neuron Circuits with Ferroelectric Analog-Memory Weights", ipscience.iop.org, Jpn. J. Appl. Phys., vol. 32, Part 1, No. 1B, Jan. 1993, pp. 442-446.

* cited by examiner

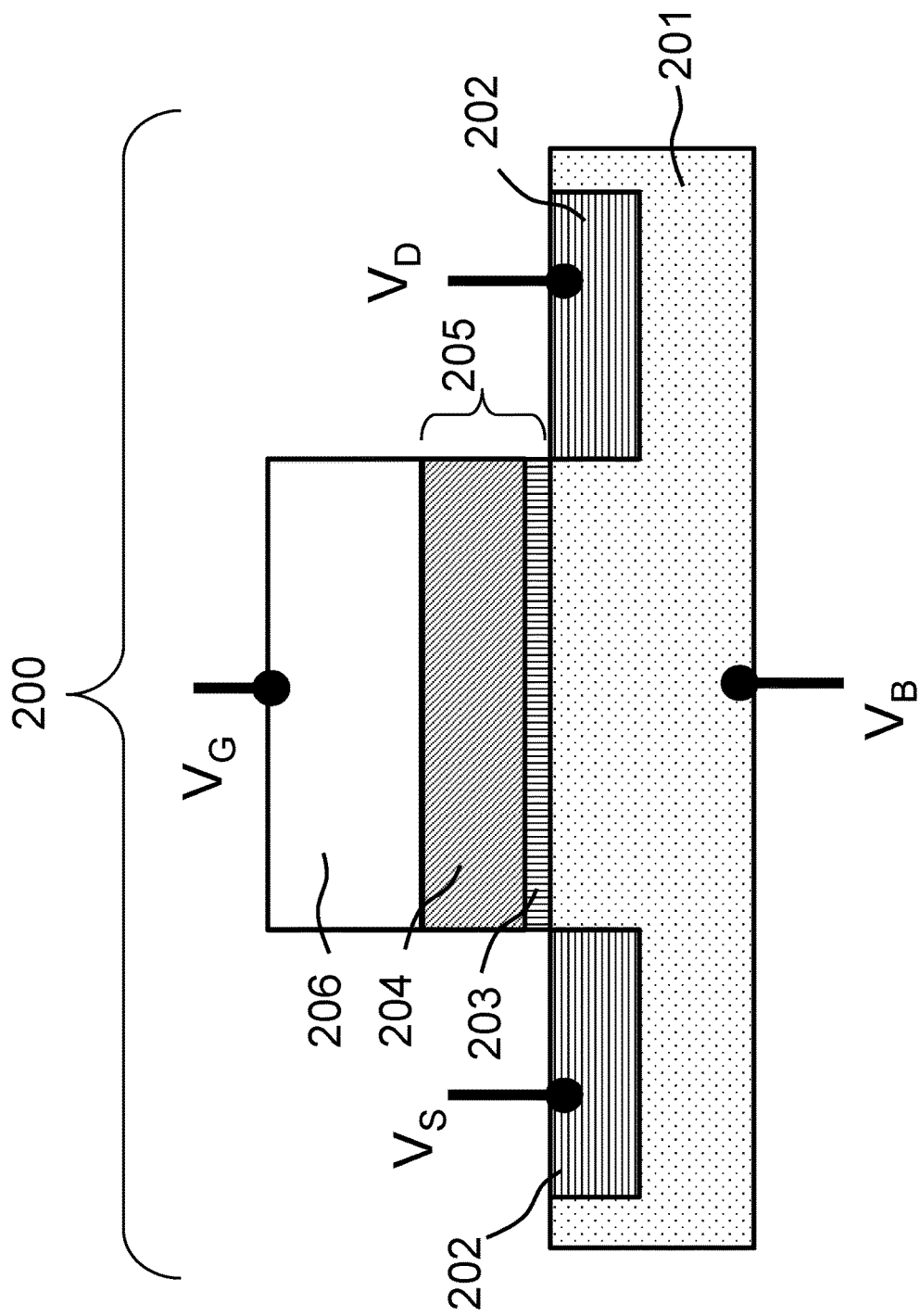

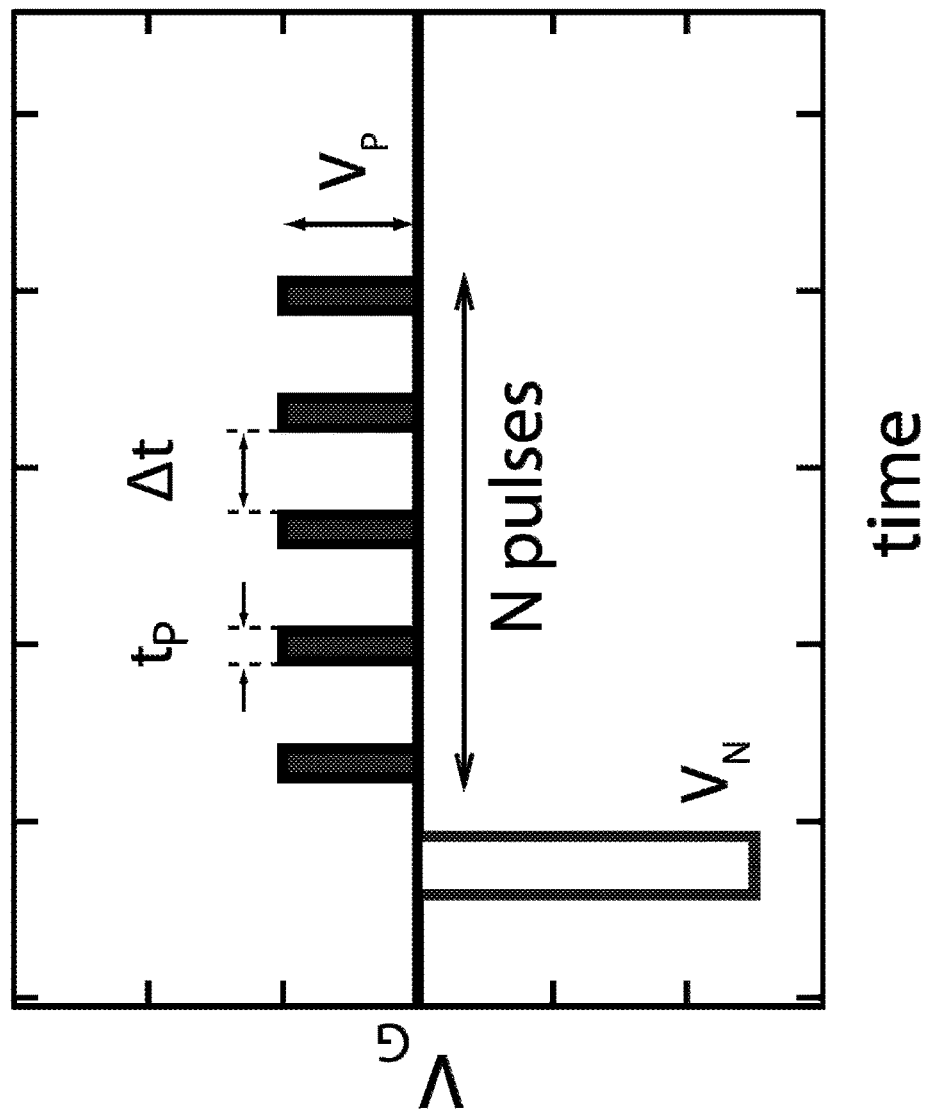

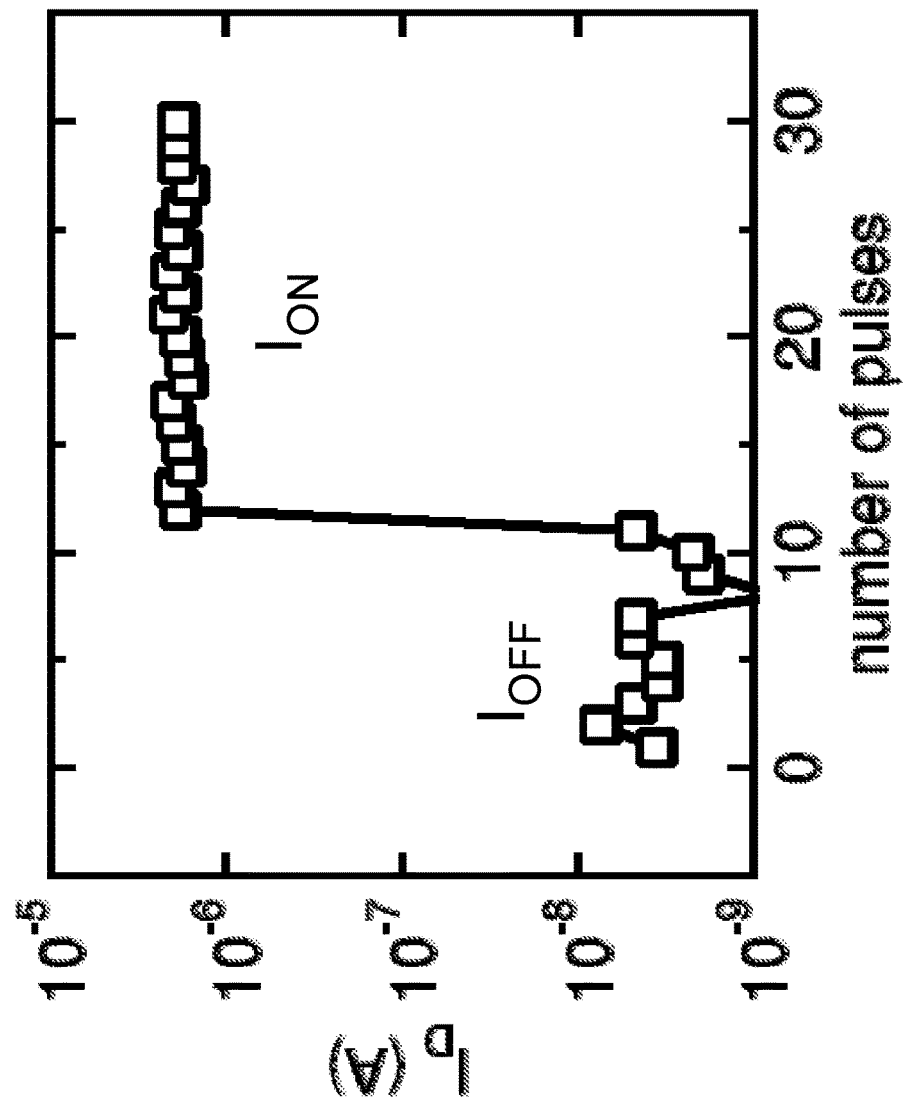

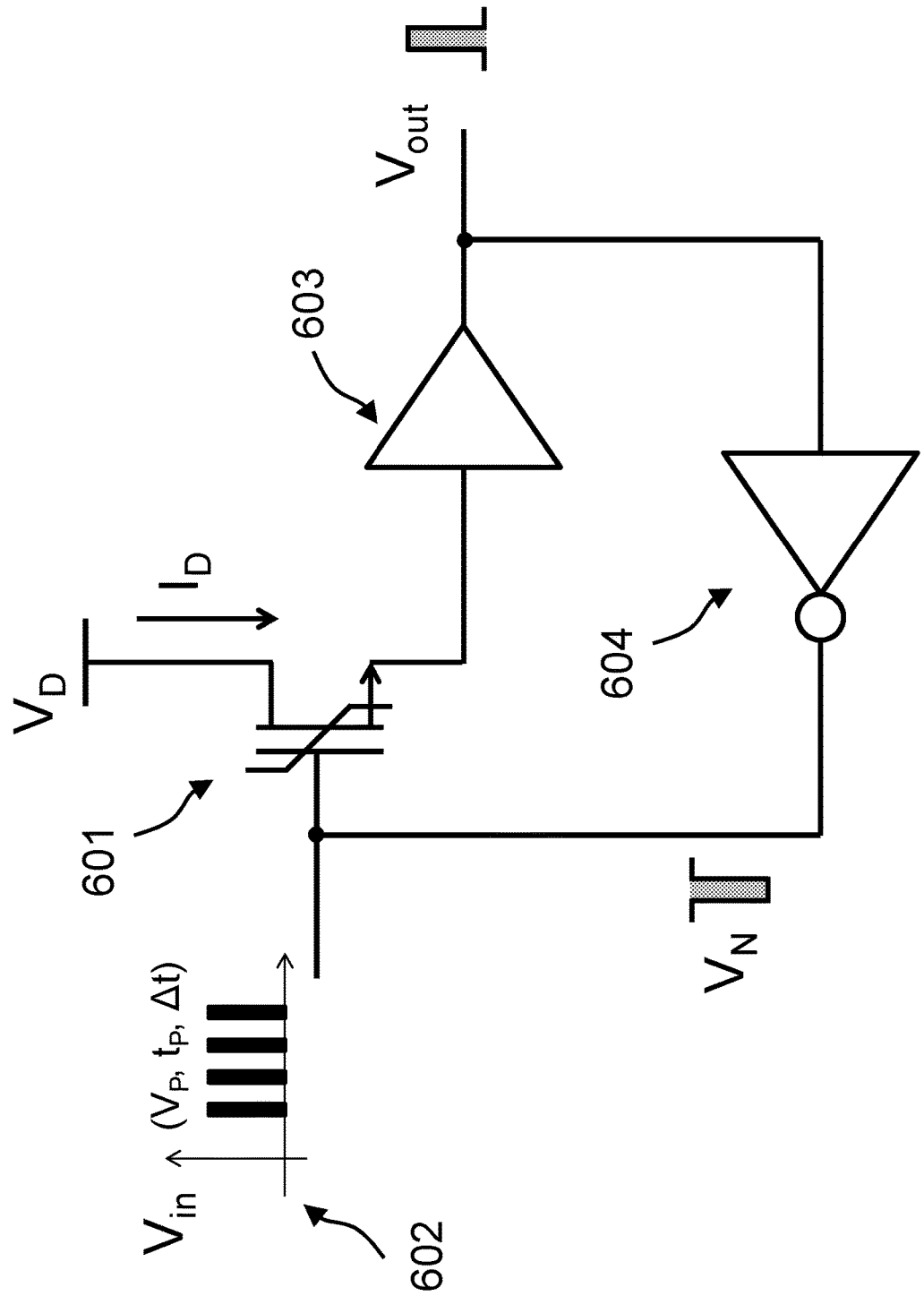

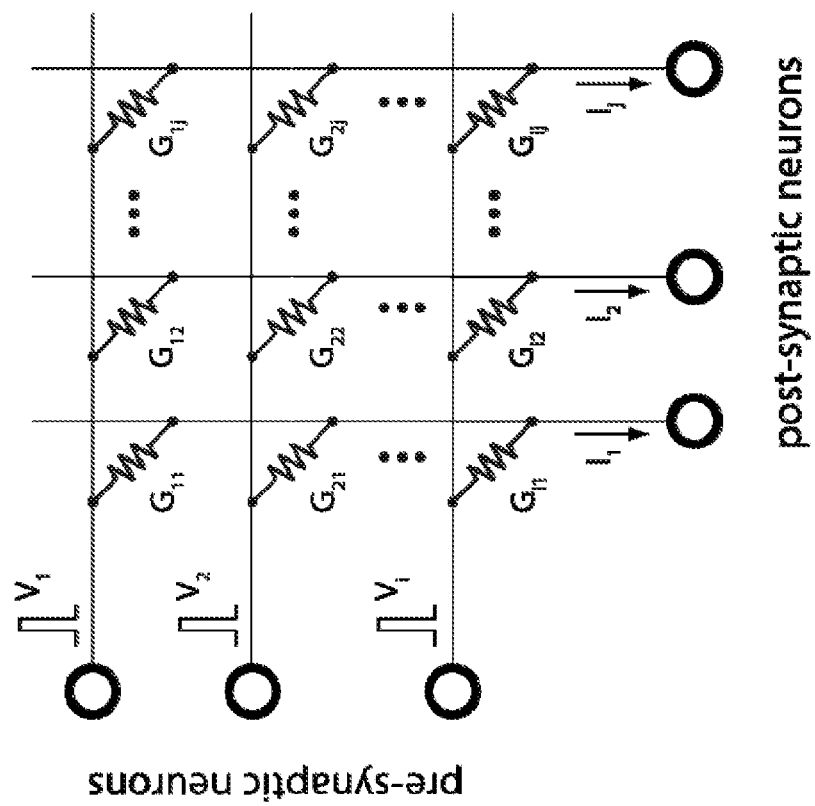

ARTIFICIAL NEURON BASED ON FERROELECTRIC CIRCUIT ELEMENT

CROSS-REFERENCE TO RELATED APPLICATION

This application claims the benefit of U.S. Provisional Application No. 62/722,532, filed on Aug. 24, 2018, hereby incorporated herein in its entirety by reference.

BACKGROUND

This invention is related to neuromorphic electronic elements and more particularly to artificial neurons.

Neuromorphic computing refers to a broad range of devices, models and computing architectures, which are inspired by the computation of the biological brain. Neuromorphic architectures are seen as a solution for overcoming the limitations of the conventional computers, which rely on the von Neumann sequential paradigm. The separation between computing units and memory in the conventional computers causes a low bandwidth, known as the von Neumann bottleneck. Moreover, power consumption issues associated with Moor's law and the Dennard scaling urge for low power computing alternatives. Mimicking the architecture and computation of the human brain represents a compelling alternative in this regard due to the brain's massive parallelism, low power consumption even for extremely complex tasks, fault tolerance and speed of computation.

The fundamental building blocks of the biological nervous system are neurons and their interconnections, called synapses. A neuron receives signals (spikes) from other neurons in the network. These signals are accumulated in the form of a potential increase in the neuron membrane (synaptic excitation) and can elicit an output spike from the neuron (the neuron fires) when a certain threshold potential is reached. After the output spike is emitted, the neuron returns to its starting rest state and is again ready to integrate incoming spikes. This behavior is usually described by the so called integrate-and-fire (IF) models. FIG. 1a to FIG. 1c show a schematic representation of an IF neuron N1 (100) which receives input spikes filtered through a column of synapses (101). Each incoming spike coming from another neuron in the network is filtered through a corresponding synaptic weight w. Neuron N1 implements integration and threshold firing behaviors.

The accumulated post-synaptic excitation in neuron N1 can eventually induce the emitting of an output forward- and back-propagating spike. The back-propagating spikes can potentially modify the strength (weight) of the synapses (101).

The rate (frequency) of the output spikes from neuron N1 depends on the total input spike amplitude: the larger the amplitude, the higher the firing rate.

The amplitude of the output spikes is generally constant, it does not depend on the input amplitude/rate, and does not present intermediate states. This is usually referred to as all-or-nothing firing.

Known hardware realizations of neurons have mainly been limited to CMOS analog (and digital) circuits. These neuron circuits contain several CMOS transistors and usually a capacitor, which is intended to accumulate charge and emulate the integration behavior. This approach may be not suitable to map more than $10^{10}$ neurons of the human brain, both from power consumption and area related considerations. Emerging nanoelectronic elements, such as resistive memory cells (e.g. phase change memory cell) or metal-to-insulator transition devices, have recently been considered for implementing neuronal behavior. Physical realization of compact neural networks with such elements might not be advantageous over the pure CMOS circuit approach, due to their intrinsic two-terminal structure and the need for additional electronic components (such as driving transistors, comparators, amplifiers, low-pass filters etc.) and/or high power consumption and/or CMOS incompatible integration.

A Ferroelectric Field-Effect Transistor (FeFET) is a three or four terminal device, including gate, source and drain terminals, or gate, source, drain and bulk terminals, respectively. For a certain class of ferroelectric materials (e.g. binary oxides, including hafnium and hafnium-zirconium oxide) employed for the gate insulator, the FeFET is a fully CMOS compatible device and provides fast read and write access times and lower power consumption.

SUMMARY

One examples describes an integrated circuit element comprising a polarizable material layer having at least two polarization states, each polarization state representing a logic value, and the polarizable material layer being disposed between a first and a second electrode connected to input/output terminals of the integrated circuit element. A change of the logic value can be accomplished by applying a number of voltage pulses to one terminal of the element, where each voltage pulse individually is insufficient for changing the polarization state from one logic value to a second logic value (sometime referred to as an accumulation operation mode). This represents the property of the polarization based integrated circuit element to accumulate (or integrate) the electrical excitation of the applied voltage pulses over time and to change the polarization state only after a number of received pulses are applied to the polarizable material layer. The number of voltage pulses resulting in a change in polarization state of the polarizable material layer depends on a magnitude and duration of the voltage pulses.

In accordance with examples described herein, the integrated circuit element comprises a transistor having a polarization-based logic gate having at least two polarization states, the each polarization state representing a different logic value. A plurality of input/output terminals are connected to apply voltage pulses to selected input/output terminals or to sense selected input/output terminals, including sensing a drain current of the transistor which is representative of the logic value (polarization state) of the transistor. A change of the logic value, according to examples, is achieved by applying a number of voltage pulses to the gate, where each of the voltage pulses alone is insufficient for changing from one logic value to a second logic value. By applying a consecutive number of voltage pulses, each having a magnitude and duration, the polarization state of the transistor changes, which results in a drain current change of the transistor. The change in the polarization state after a number of received pulses represents a property of the polarization based logic gate to accumulate electrical excitation (accumulation property).

In another example, the circuit element a capacitor structure includes a polarizable material layer having at least two polarization states, the polarization states representing logic values. A plurality of input/output terminals connected to apply voltages to the electrodes of the capacitor, including a gate of a transistor with a resulting drain current of the transistor representing the logic value. The change of the logic value can be accomplished by applying a number of pulses to one of the electrodes of the capacitor structure, where each pulse individually is insufficient to change from one logic value to a second logic value (accumulation operation mode). By choosing a magnitude and duration of such voltage pulses, a number of voltage pulses for changing the polarization state may be adjusted.

In accordance with examples described herein, an integrated circuit comprises a polarization-based logic gate as an integrated circuit element, along with additional circuital blocks, such as amplifiers and/or inverters for self-resetting. A change of a logic value of the logic gate resulting in a drain current change of a transistor can be used for a reset of the logic value such as by feeding the change in drain current back to the logic input signal of the polarization-based logic gate.

In accordance with examples described herein, an integrated circuit comprises a polarization-based logic gate integrated circuit element and additional circuital blocks, such as amplifiers and/or inverters for self-resetting an artificial neuron apparatus defined by the integrated circuit, including a polarization-based logic gate. A change in logic value of the polarization-based logic gate, in one example, is accomplished by applying a number of voltage pulses to a gate of the logic gate, where each of the voltage pulses individually is insufficient to change the logic value from one logic value to a second logic value (i.e., changing from one polarization state to another). By applying a number of voltage pulses, each having a magnitude and a duration, to the gate the polarization state of the polarizable material changes from one polarization state to another, whereby such change results in a drain current change of the device (output spike). The change of the logic value resulting in a drain current change (action potential) can be used for resetting the logic value (resetting the polarization state), such by feeding the change in drain current back to the logic input signal of the gate for self-resetting (return to starting rest state).

In accordance with examples described herein, an integrated circuit comprises an artificial neuron apparatus comprising a polarization-based logic gate combined with synapses (e.g., voltage sources providing voltage pulses). In one example, the circuit is arranged such that artificial neuron receives inputs (voltage pulses) from synapses, where the polarization-based logic gate has an electrical charge integration and threshold firing property. It is understood that input signal for a neuron apparatus comprising a polarization-based logic gate can be by one or more synapses. It is also understood that the output signal (output spike) of the neuron apparatus (e.g., a polarization-based logic gate) can be fed into one or more synapses.

In accordance with examples described herein, an integrated circuit comprises a ferroelectric logic gate including a layer of ferroelectric material. A polarization state of the ferroelectric material can be changed by applying a number of pulses to the gate, each of which is separately insufficient for changing from one logic value to a second logic value, but which together cause a change in the polarization state (accumulation operation mode). It is understood that a voltage for changing from the ferroelectric material layer from one logic value to a second logic value (i.e., one polarization state to another) is a coercive voltage of the layer of ferroelectric material, or the lowest coercive voltage of at least one domain of the ferroelectric material. Thus, the polarization state of the ferroelectric material can be used to store the information of the accumulated electrical signal.

In accordance with the examples described herein, by choosing a magnitude and duration of such voltage pulses, a number of voltage pulses to change the polarization state may be adjusted. It is understood that the number of electrical pulses to the gate, each of which insufficient for changing the from one polarization state to a second polarization state, can be realized by identical pulses of same magnitude, duration, and time in between two pulses of a number of pulses varying in magnitude, duration, and time between two pulses.

BRIEF DESCRIPTION OF THE DRAWINGS

FIG. 2c illustrates a cross-sectional view of an example of a metal ferroelectric semiconductor (MFS) structure, representing a FeFET structure where the gate, source, drain and bulk terminals are connected to voltage sources, applying the voltages $V_G$, $V_S$, $V_D$ and $V_B$, respectively.

FIG. 3 illustrates an example of gate voltage pulses for achieving accumulative switching mode in a FeFET.

FIG. 4 illustrates an example of accumulative switching in a FeFET, where an abrupt drain current increase occurs after a several gate pulses are delivered to a FeFET.

FIG. 6d illustrates an example circuit implementation of an artificial neuron apparatus, which comprises a FeFET and additional circuital blocks, such as amplifiers and inverters for self-resetting.

FIG. 7a is a schematic of an example circuit implementing an artificial neuron comprising inputs coming from synapses and having integration and threshold firing functions by use of a FeFET and additional circuital blocks.

DETAILED DESCRIPTION

The present invention provides an integrated circuit element comprising a polarizable material layer having at least two polarization states, the polarization state representing a logic value and being disposed between a first and a second electrode connected to input/output terminals of the integrated circuit element. In one embodiment a polarization-based logic gate of a transistor having at least two polarization states, the polarization state representing a logic value used for accumulation switching and in specific artificial neurons. One example, in accordance with the present disclosure, describes a ferroelectric field-effect transistor (FeFET).

In one example, a gate oxide of a FeFET comprises a ferroelectric material or a series of dielectrics with a ferroelectric. In one example, a switching of the electric polarization in the ferroelectric achieved by applying an external electric field can be used to tune a conductivity of the transistor channel and, therefore, tune its threshold voltage. In one example, such switching can be accomplished by a single pulse (binary operation mode). In other examples, the switching can be accomplished by applying a number of identical pulses, each of which is insufficient individually for switching (accumulation operation mode). In one example, this accumulation property in FeFETs is used to implement an artificial neuron, as explained in the following text.

Figure 2A:
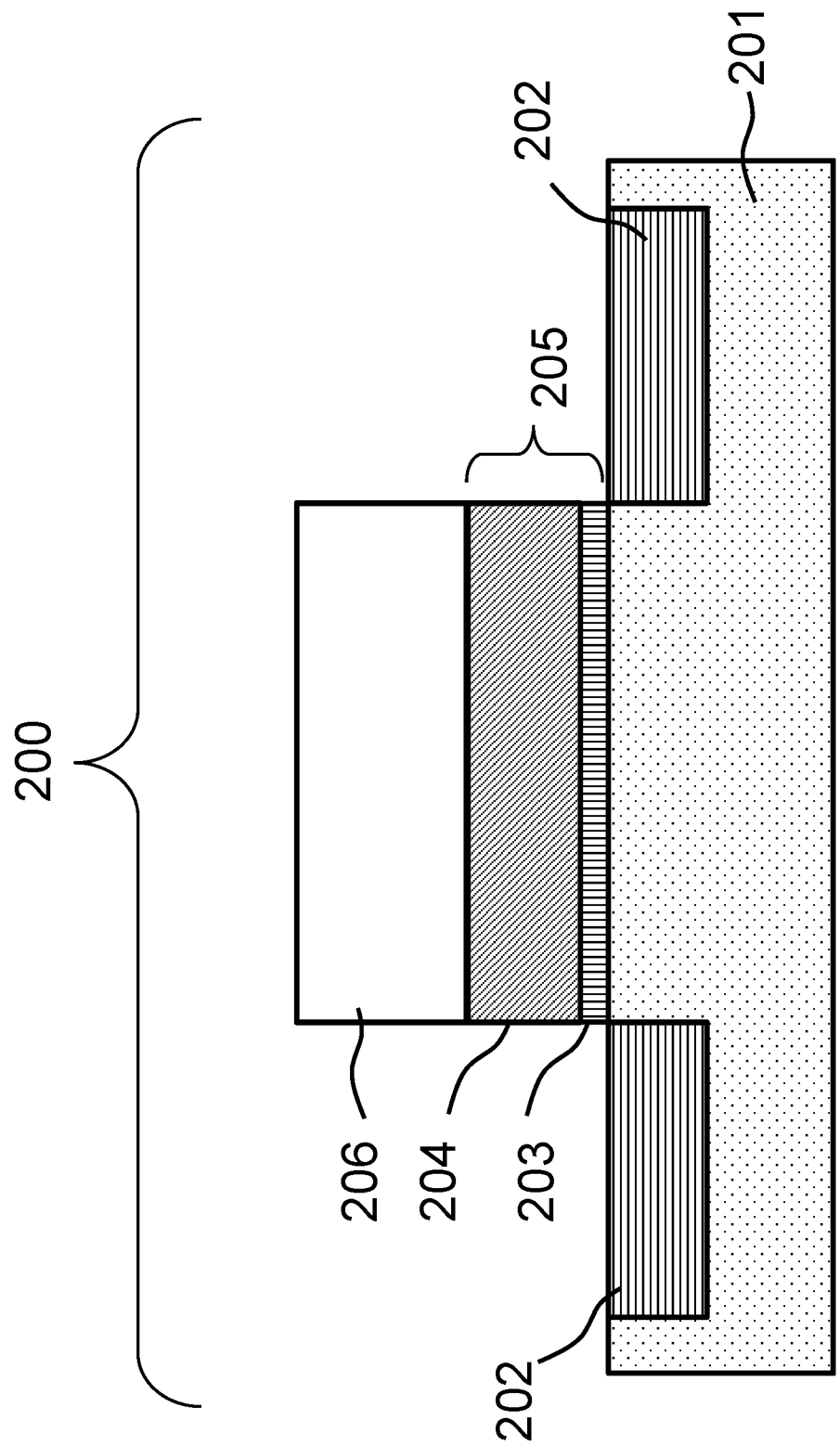
FIG. 2a illustrates a cross-sectional view of an example of a metal ferroelectric semiconductor (MFS) structure.
Figure 2B:
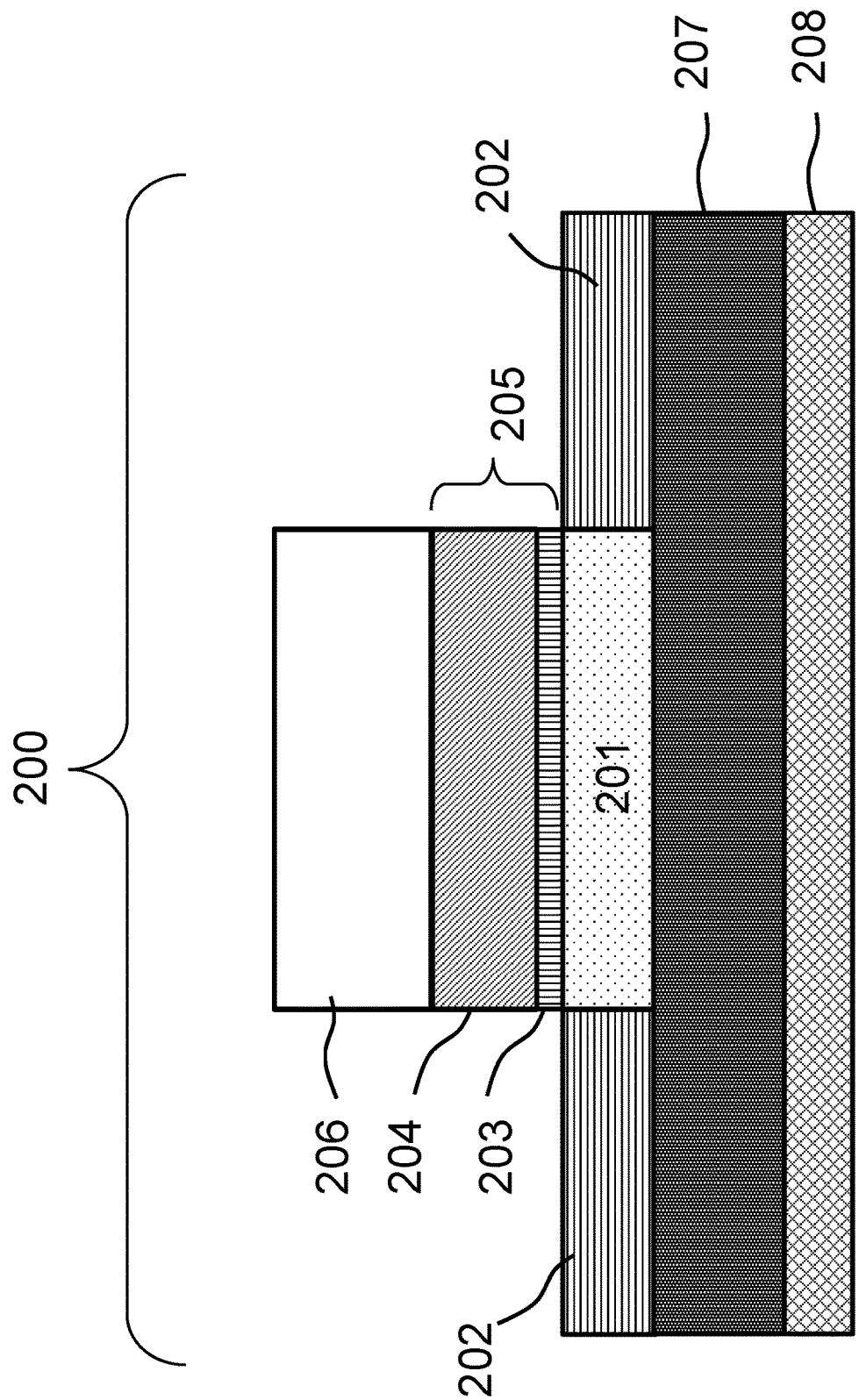
FIG. 2b illustrates a cross-sectional view of an example of a metal ferroelectric semiconductor (MFS) structure on an SOI substrate.

In examples, the FeFET structure can be formed by, but not limited to, using a metal ferroelectric semiconductor (MFS) gate stack fabricated on a bulk semiconductor substrate (e.g. by means of the high-k metal gate technology), such as depicted in FIG. 2a. In other examples, the FeFET can also be formed in a fully-depleted silicon on insulator (FDSOI) technology, as depicted in FIG. 2b.

Referring to the cross-sectional view of FIG. 2a, one example of a MFS structure 200 includes a support structure 201 comprising a carrier material, such as a silicon compound. An interfacial layer 203 may be formed over layer 201, which may comprise any suitable materials including, without limitation, $SiO_2$ or SiON or other silicon containing material. In one example, a ferroelectric material oxide layer 204 is formed over layer 203 or directly over layer 201. The term "ferroelectric material", as used herein, refers to a material that is at least partially in a ferroelectric state. For example, the ferroelectric material may comprise any of $HfO_2$, $ZrO_2$, any ratio of Hf and Zr combined with oxygen (e.g., $Zr_xHf_{1-x}O_2$, where x<1), as well as any combinations thereof.

In one example, ferroelectric material oxide layer 204, together with interfacial layer 203, form a layer stack 205.

The conductive layer 206, which represents a gate contact of the transistor, can comprise any one or more suitable conductive metals including, without limitation, TiN, TaN, TaCN, WCN, Ru, Re, RuO, Pt, Ir, IrO, Ti, TiAlN, TaAlN, W, WN, C, Si, Ge, SiGe and NbCN. It is to be understood that the material of the conductive layer might be chosen such that the work-function of the respective material may influence the coercive voltage of the adjacent ferroelectric material oxide layer in a way which is beneficial for the operation of the FeFET.

An example process for forming the MFS structure of FIG. 2a is described below. A carrier structure 201 is provided that may comprise a Si (silicon) compound, such as SiGe (silicon-germanium), or silicon-on-insulator (SOI), for example. It is noted that other semiconductor materials can also be provided as the carrier structure 201 including, e.g., III-V semiconductor compounds such as GaAs or any other suitable substrate material. The carrier structure 101 may have already been processed so as to include components and/or other devices already be formed within the carrier structure (e.g., high-k-metal-gate (HKMG) and SOI).

In one example, an interfacial layer 203 is formed on the support structure 201 to improve the transistor channel to gate oxide interface quality, to reduce the number of charge traps, to prevent chemical reactions between the support structure 201 and the ferroelectric material oxide layer 204, and to influence the retention and accumulation switching properties of the device.

In examples, layer 204 can be formed utilizing any one of atomic layer deposition (ALD), metal organic atomic layer deposition (MOALD), chemical vapor deposition (CVD), metal organic chemical vapor deposition (MOCVD), physical vapor deposition (PVD), molecular beam epitaxy (MBE) deposition, Sol-gel, or any other suitable deposition technique that facilitates formation of the layer including the ferroelectric material as described herein (i.e., oxygen and at least one of Hf and Zr). Any suitable number and types of precursors may be utilized to introduce elements such as Hf and Zr into the layer 204 utilizing any of the deposition techniques as described herein. In examples, layer 204 is formed to have a suitable thickness, e.g., in the range from about 2 nm to 500 nm. In an example embodiment, the thickness range from layer 204 can be within the range from about 2 nm to about 15 nm.

In addition, in examples, ferroelectric material oxide layer 204 can be formed to include, in addition to the ferroelectric material, dopants or further additives that may support the crystallization of layer 204 into a state having ferroelectric properties. The additives can be included with the precursor materials, e.g., so as to be included during formation of the layer 204. Alternatively, the additives can be introduced into the formed layer 204 by ion implantation or any other suitable process. A concentration of the further additives within the layer may be set within a range from about 0.05 at % (atomic percent, as measured by ratio of additive atoms to ferroelectric material atoms) to about 30 at %, within a range from about 0.05 at % to about 10 at %, within a range from about 0.05 at % to about 5 at %, within a range from about 0.5 at % to about 3.5 at %, or a range from about 1 at % to about 3.5 at %. In general, the amount of the further additives may depend on the thickness of the layer 204. When increasing the thickness of the layer 204, the concentration of the further additives may also be increased to achieve a desired crystallization having ferroelectric properties.

Any suitable additives may be provided within ferroelectric material oxide layer 204 including, without limitation, any one or more of C, Si, Al, Ge, Sn, Sr, Pb, Mg, Ca, Sr, Ba, Ti, Zr (e.g., providing Zr as an additive in a $HfO_2$ layer), Ti, and any one or more of the rare earth elements (e.g., Y, Gd, etc.).

In examples, conductive layer 206 of the embodiments of FIG. 2a, FIG. 2b and FIG. 2c can be formed utilizing any one of atomic layer deposition (ALD), metal organic atomic layer deposition (MOALD), chemical vapor deposition (CVD), metal organic chemical vapor deposition (MOCVD), physical vapor deposition (PVD), molecular beam epitaxy (MBE) deposition, Sol-gel, or any other suitable deposition technique that facilitates formation of the layer. The conductive layer can be formed from any of the types of conductive materials as previously described for conductive layer 208, and the thickness of conductive layer 206 can be in the range of 1 nm to 10 nm or 1 nm to 300 nm.

Figure 1A:
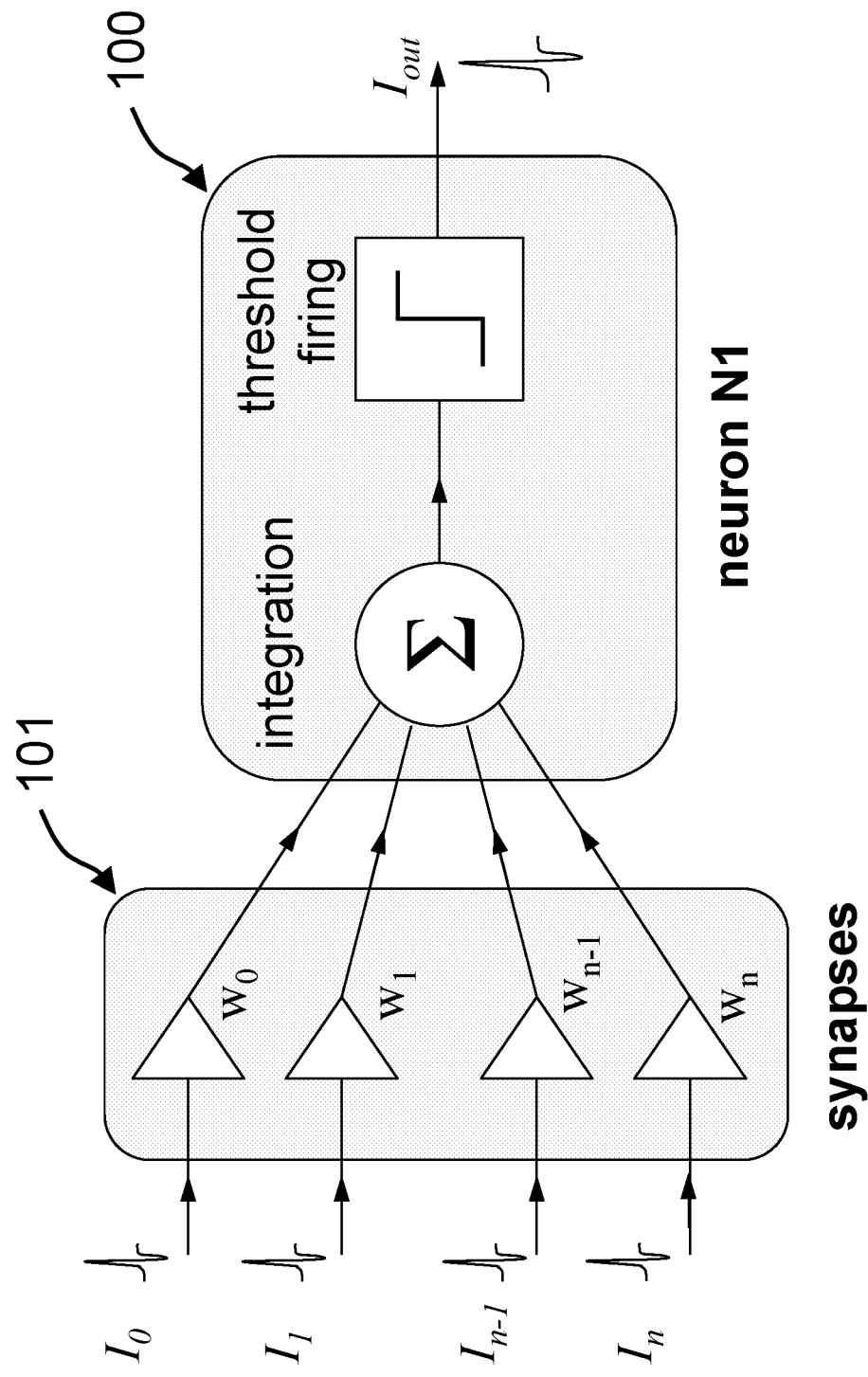
FIG. 1a is a schematic of one example of an artificial neuron comprising inputs coming from synapses and having integration and threshold firing functions.
Figure 1B:
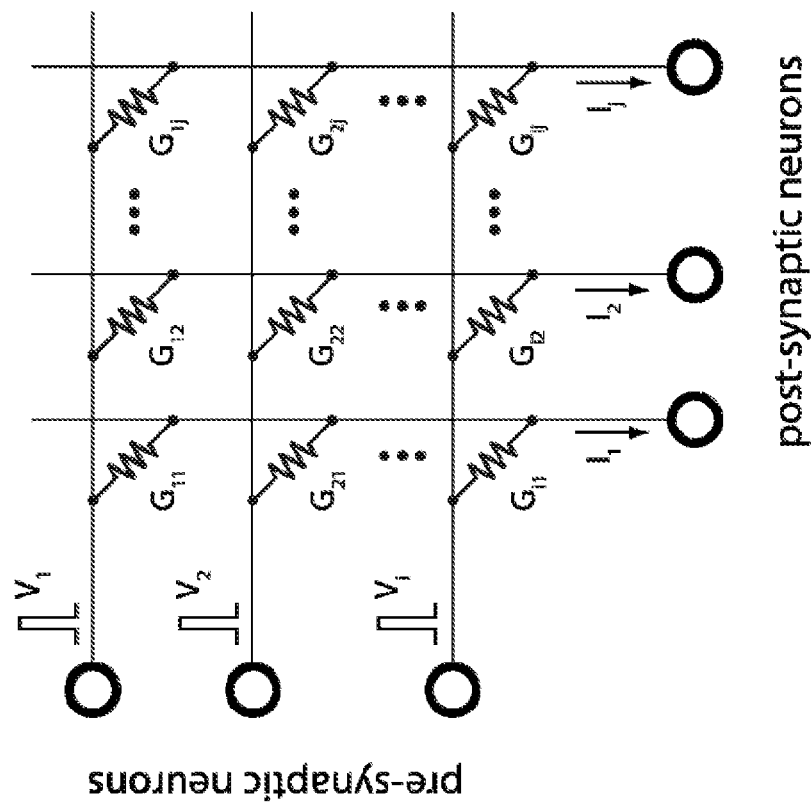
FIG. 1b is a schematic of one example of a circuit implementing an artificial neuron comprising inputs coming from synapses and having integration and threshold firing functions.

In examples, conductive layer 206 of the embodiments of FIGS. 1a and 1b provides a covering layer for the ferroelectric material oxide layer 203 and can also serve as an electrode for the implementation of the MFS (e.g., gate electrode) of the integrated circuit element.

In example, a further covering layer can also be provided between the ferroelectric material oxide layer 203 and conductive layer 206. Such further covering layer can be deposited prior to forming the conductive layer 206 utilizing any suitable deposition process such as any of the previously described processes, and the further covering layer can comprise any suitable materials such as $SiO_2$, $Al_2O_3$, $Sc_2O_3$, $Y_2O_3$, BaO, MgO, SrO, $Ta_xO_y$, $Nb_xO_y$, TiO, and lanthanum dioxides. The further covering layer may also be formed in a same deposition process with the second ferroelectric material oxide layer 203 by changing the supply of source/precursor materials during the deposition process (thus allowing the deposition to be performed within the same deposition chamber).

In examples, after the layers have been formed, an anneal process is carried out at one or more suitable temperatures and for one or more suitable time periods to achieve a suitable amount of crystallization for the ferroelectric material within the ferroelectric material oxide layer 203. In one example, the anneal process is carried out to heat the ferroelectric material oxide layer 203 to a temperature that is above the crystallization temperature of the ferroelectric material so as to at least partially alter its crystal state from amorphous to crystalline, thus resulting in a crystallized oxide within the ferroelectric material oxide layer 203. A Crystallization temperature may be chosen in a range of, e.g., from about 400° C. to about 1200° C. depending on the thermal budget of the used devices. In one example, a crystalline temperature for the annealing process is at a temperature that is above the onset of crystallization for the ferroelectric material (when the ferroelectric material is amorphous, i.e., after the layer 103 is deposited and before annealing occurs) and is further greater than about 500° C., or at a temperature that is above the onset of crystallization for the ferroelectric material and is further greater than about 300° C. In examples, the time period for annealing can be from about 0.01 second to about 12 hours. These annealing temperature ranges induce partial crystallization of the ferroelectric material oxide layer 203 (e.g., crystallization to a suitable level within the layer 203 that is less than complete crystallization of the ferroelectric material).

In examples, the layer stack 209 can comprise a single ferroelectric material oxide layer, or can comprise a multitude of ferroelectric material oxide layers, or in another examples can comprise additional conductive or isolating interfacial layers, separating the individual ferroelectric material oxide layers.

In examples the MFS structure can be formed with any suitable geometries including, without limitation, planar or 3D geometry such as Trench MOSFET, FinFET, RCAT ("Recessed Channel Array Transistor"), TSNWFET ("Twin Silicon NanoWire Field Effect Transistor"), PiFET ("Partially insulated Field Effect Transistor"), McFET ("Multichannel Field Effect Transistor").

In examples, the Source and Drain regions 202 of MFS structure 200 can be formed as metallic regions, thus forming a SFET ("Schottky-Transistor"). In other examples, the Source and Drain regions 202 of MFS structure 200 can also be formed with two different dopants species to form a TFET ("Tunneling Field Effect Transistor").

In examples, the patterning of the ferroelectric material oxide layers can be performed in a different way than by etch. In another example, the ferroelectric material oxide layer is deposited into a pre-structured trench, thus confining the formation of the domains. In another example, the ferroelectric material oxide layer is deposited self-aligned by self-aligned selective growth on top of a pre-structured supporting structure 101, thus confining the formation of the domains. In this way, the targeted formation of ferroelectric domains with targeted size can be realized in order to adjust the switching properties of the single domains.

FIG. 3 illustrates an example of gate voltage pulses to be applied to the FeFET structure of FIGS. 2a, 2b and 2c to implement cumulative switching. In one example, the negative pulse $V_N$ is applied to set the device in a high threshold voltage ($V_T$) state, which, according to the present discussion, is considered as a starting or reference state. In one example, a number of positive pulses are then applied, each of which has an amplitude $V_P$, and a duration $t_P$, where a time between single pulses (inter-arrival time) is denoted $\Delta t$. In one example, $V_P$ and $t_P$ are chosen such that a single pulse having these parameters is not sufficient to switch the FeFET. In one example, $V_P$ and $t_P$ are chosen such that a consecutive application of certain critical number, $N_P$, of such gate voltage pulses switches the device. This represents the accumulation property of a FeFET to accumulate the electrical excitation and switch the polarization upon receiving the number of pulses $N_P$.

FIG. 4 illustrates an example of the experimental behavior of a FeFET device having channel length and channel width 30 nm and 80 nm, respectively, upon the gate voltage excitations illustrated in FIG. 3. In the example, the FeFET was initially in the high-VT state, which is achieved by applying a negative pulse $V_N$. The high-VT state is characterized by a low drain current (IOFF) at the sensing voltage of VG=0V. In FIG. 4, the drain current ($I_D$) (sensed at VG=0V and VD=100 mV) is shown as a function of the number of applied $V_P$ pulses. In the example, the first 11 pulses do not induce any visible change of the drain current, whereas an abrupt switching is evident after the $12^{th}$ pulse is received by the FeFET. This exemplifies that for this specific combination of pulse parameters ($V_P$=2.2 V and $t_P$=1 µs), 12 pulses are accumulated to achieve switching, whereas a single pulse having these parameters, or any accumulated number of pulses, Np, which is lower than 12, is not sufficient for switching.

Figure 1C:
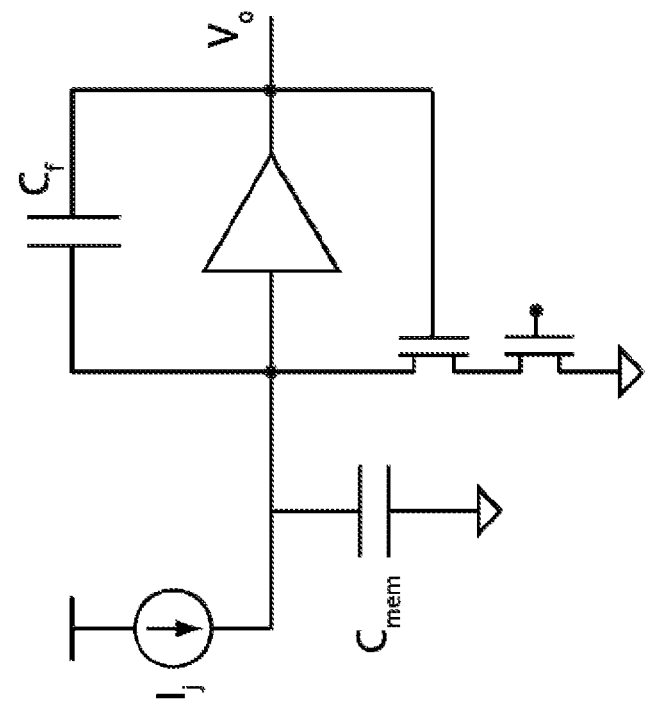
FIG. 1c illustrates one example of a circuital implementation of an artificial neuron apparatus, designed by CMOS components such as transistors, capacitors and amplifiers.

In examples, the accumulation of gate voltage pulses depicted in FIG. 3, and the subsequent FeFET switching experimentally illustrated in FIG. 4, is employed in accordance with the teachings of the present disclosure, to emulate the integration and firing properties, respectively, of the artificial neuron N1 in FIG. 1.

In examples, the threshold switching (firing) property of the artificial neuron of FIG. 1 is achieved by the polarization switching of the ferroelectric after integration of the critical number of pulses $N_P$ is integrated. This manifests through an abrupt increase of the drain current from IOFF to ION, as depicted in FIG. 4.

In view of the above, the gate pulses having parameters (VP, tp) represent neuron inputs coming from synapses. In examples, VP and/or tp can be used as parameters to encode the synaptic weight w: for example, larger VP and/or longer tp can indicate a larger w and vice versa.

Figure 5:
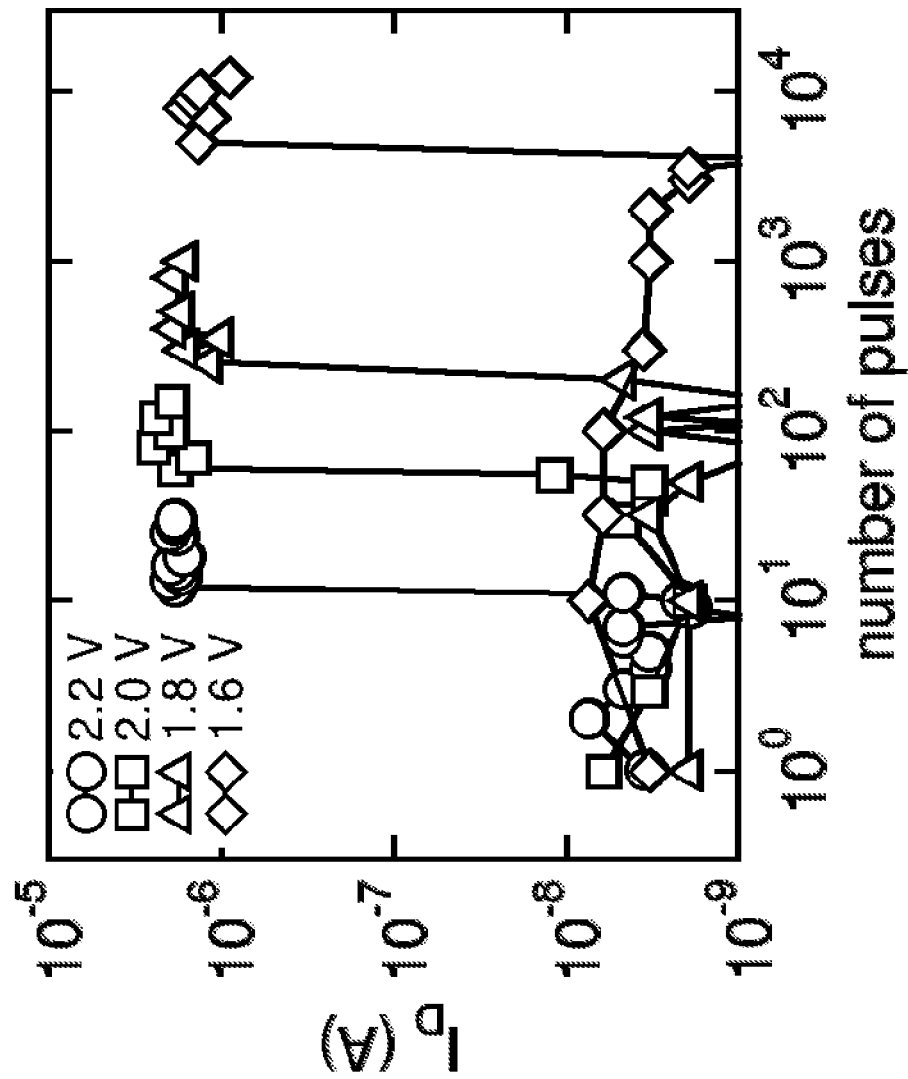
FIG. 5 illustrates an example of the dependence of the accumulative switching in a FeFET from the gate pulse amplitude.

In examples, a lower pulse amplitude, VP, will result in a larger number of pulses NP necessary to be integrated to induce firing, as depicted in FIG. 5.

In examples, a shorter pulse duration, tP, will result in a larger number of pulses NP necessary to be integrated to induce firing.

In accordance with the present disclosure, switching from IOFF to ION does not include intermediate states, but is abrupt with the two states being separated by an order of magnitude. In accordance with the present disclosure, such feature emulates the all-or-nothing firing typical for biological neurons. In examples, the all-or-nothing firing is preserved irrespective of the set of VP, tp, NP or Δt. This is illustrated in FIG. 5 for different VP values, and hence different NP values, and constant tp and Δt, where the ION/IOFF is approximately 100 irrespective of VP and NP.

Figure 6A:
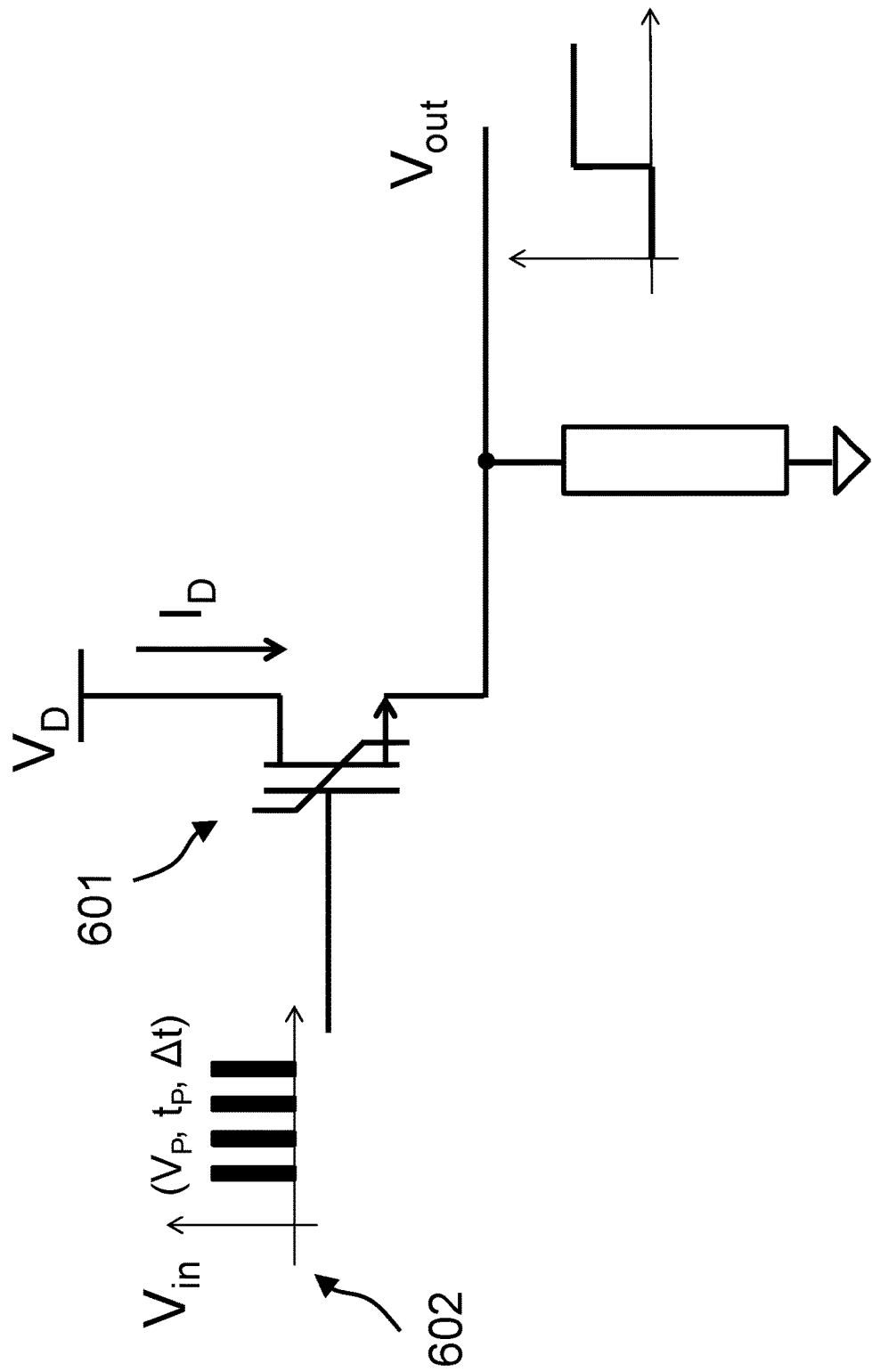
FIG. 6a illustrates an example circuital implementation of an accumulation switch, which comprises a FeFET.
Figure 6B:
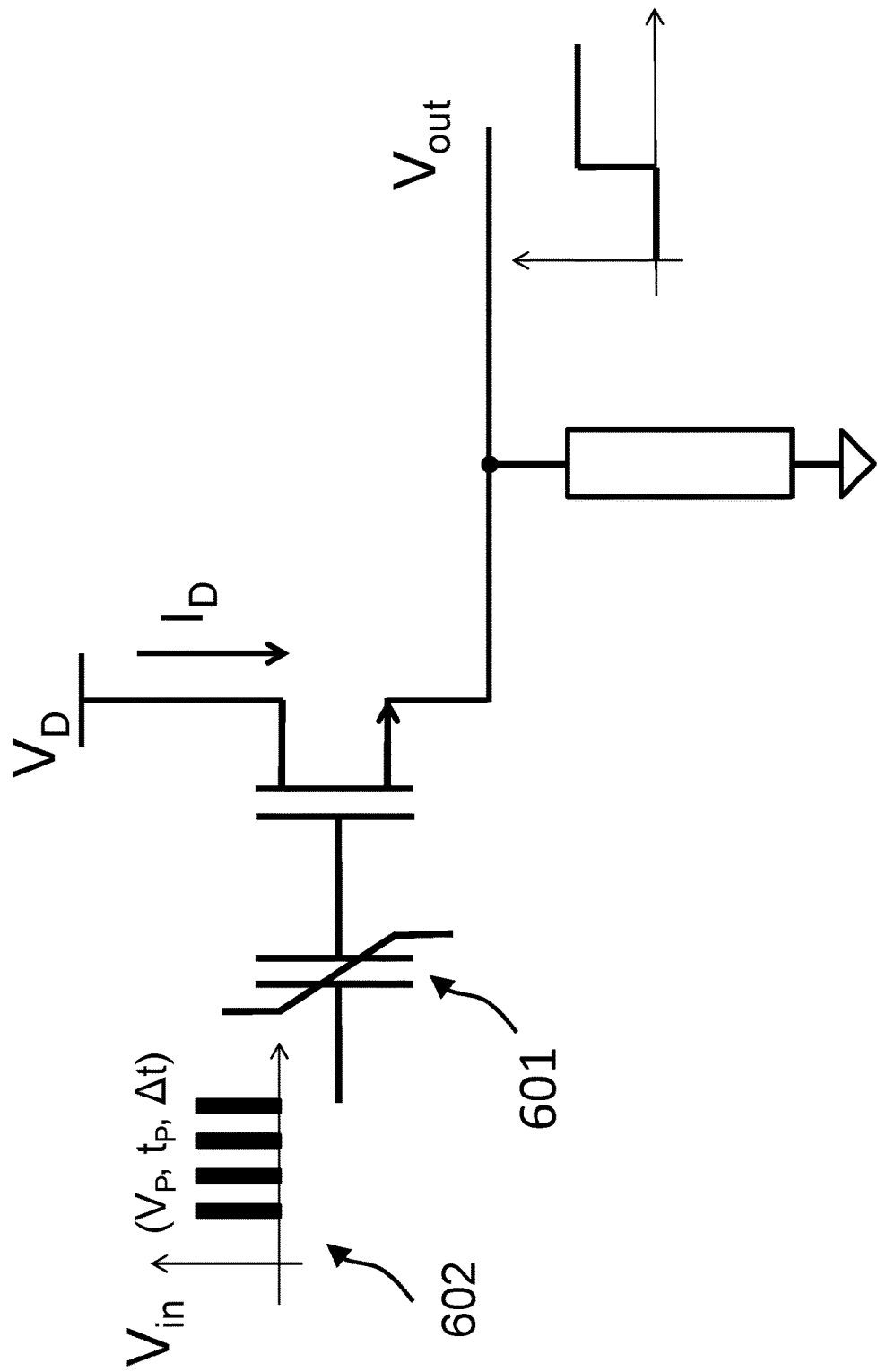
FIG. 6b illustrates an example circuital implementation of an accumulation switch, which comprises a capacitor structure.
Figure 6C:
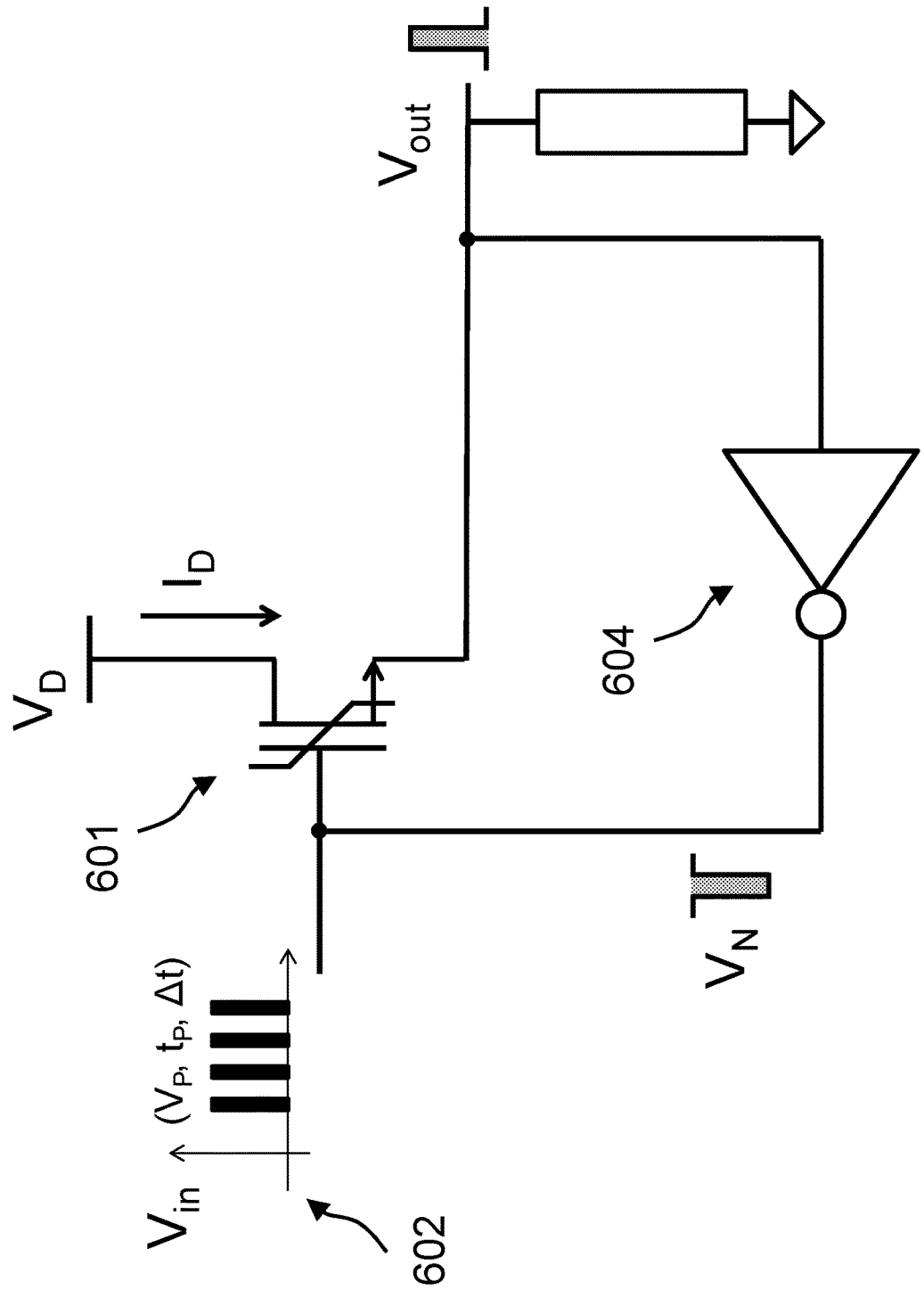
FIG. 6c illustrates an example circuital implementation of an artificial neuron apparatus, which comprises a FeFET and additional circuital blocks, such as an inverter for self-resetting.

FIG. 6a illustrates an example circuital apparatus for accumulated switching and FIGS. 6c and 6d for an artificial neuron, which contains a single FeFET (601) displaying the integrate-and-fire activity as described above. In examples, FeFET (601) can be in any of the forms as described by FIGS. 2a, 2b and 2c. In one example, FeFET (601) receives input gate pulses $V_{IN}$ (602), which are of the form discussed by FIG. 3, and which are characterized by parameters VP, tP and Δt. In one example, the input gate pulses are integrated within a FeFET (without the need of external integration elements such as a capacitor) where, after a critical number NP is reached, the FeFET will switch the polarization, which will lead to an abrupt increase of the drain current (firing). In examples, this drain current may be processed in the next circuital stage, such as indicated by the block 603, which may contain, but is not limited to, amplifiers, comparators, or circuits for reshaping and/or delaying of the signal shape and which could be adopted to achieve a desired signal to be propagated to other neurons in the network or back-propagated to the synapses of FIG. 1 to update their weight. In one example, the resulting signal is simultaneously sent through another block indicated at 604, which may comprise, but is not limited to, inverters, amplifiers and delay circuits. In one example, circuital block 604 is configured to invert the signal and produce the resetting pulse, VN, which will initialize the FeFET to its reference high-VT state and enable it to be ready for the next integrate-and-fire operation.

Figure 7B:
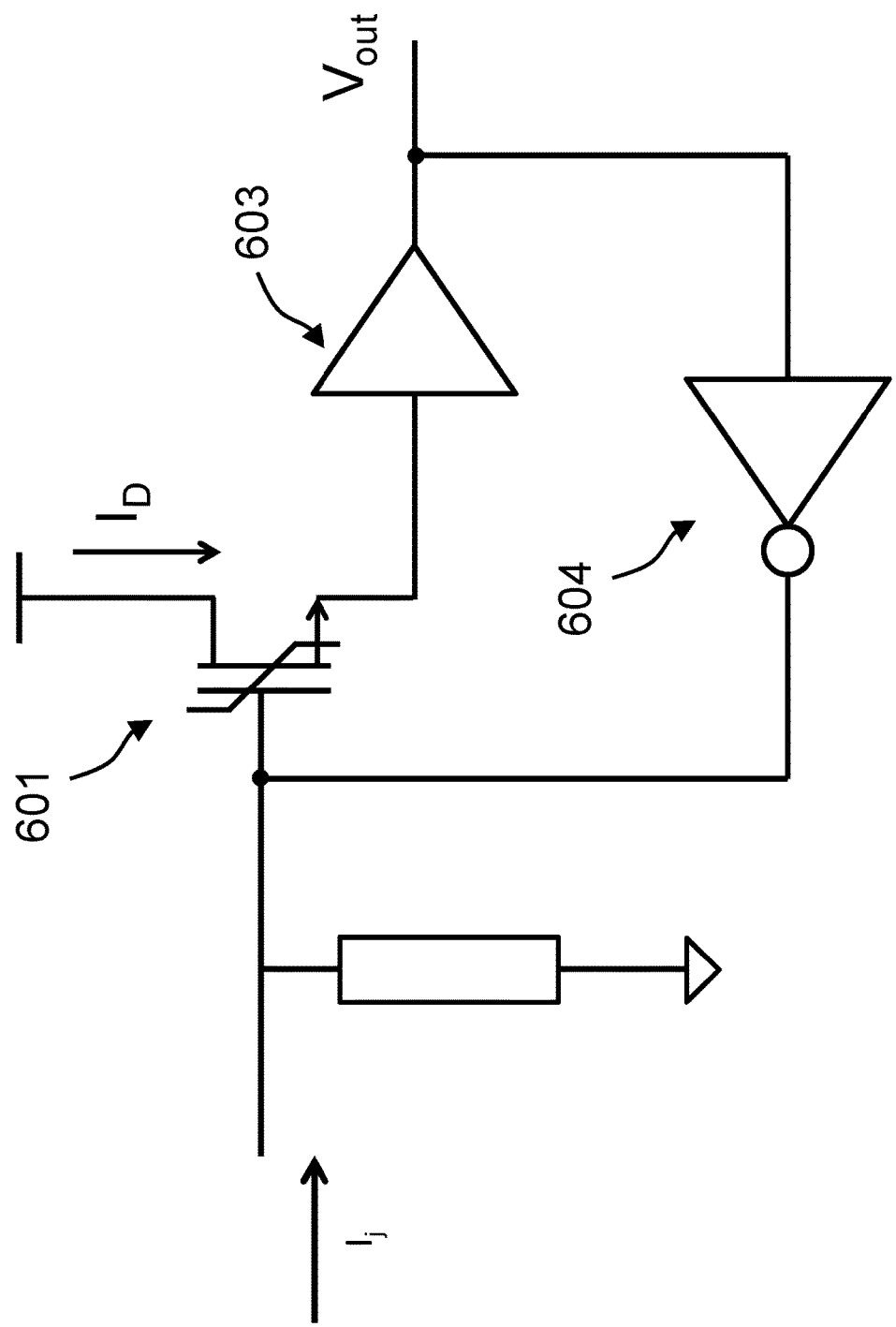
FIG. 7b illustrates an example of a circuit implementation of an artificial neuron apparatus, which comprises a FeFET and additional circuital blocks, such as amplifiers and inverters for self-resetting used as shown in FIG. 6d.

FIG. 7a illustrates an example of an integrated circuit employing artificial neurons and synapses. In accordance with examples described herein, the artificial neurons, named pre- and post synaptic neurons of the integrated circuit, comprise a polarization-based logic gate as described herein. FIG. 7b illustrated an example of how the integrated circuit element, in this case a FeFET is combined with additional circuital blocks, such as amplifiers and/or inverters for self-resetting. The circuit of FIG. 7b defines an artificial neuron apparatus comprising a polarization-based logic gate of a FeFET and amplifiers and/or inverters for self-resetting. In one example, the change of the logic value can be accomplished by applying a number of voltage pulses to the gate (spikes), each of which is insufficient for changing from one logic value to a second logic value (accumulation operation mode). By choosing a consecutive application of number, height and duration of such gate voltage pulses the polarization state is changed, which results in a drain current change of the transistor (output spike). The change of the logic value resulting in a drain current change (action potential) can be used for reset of the logic value, such by feeding the change in drain current back to the logic input signal of the gate for self-resetting (return to starting rest state), for example.

Figure 8:
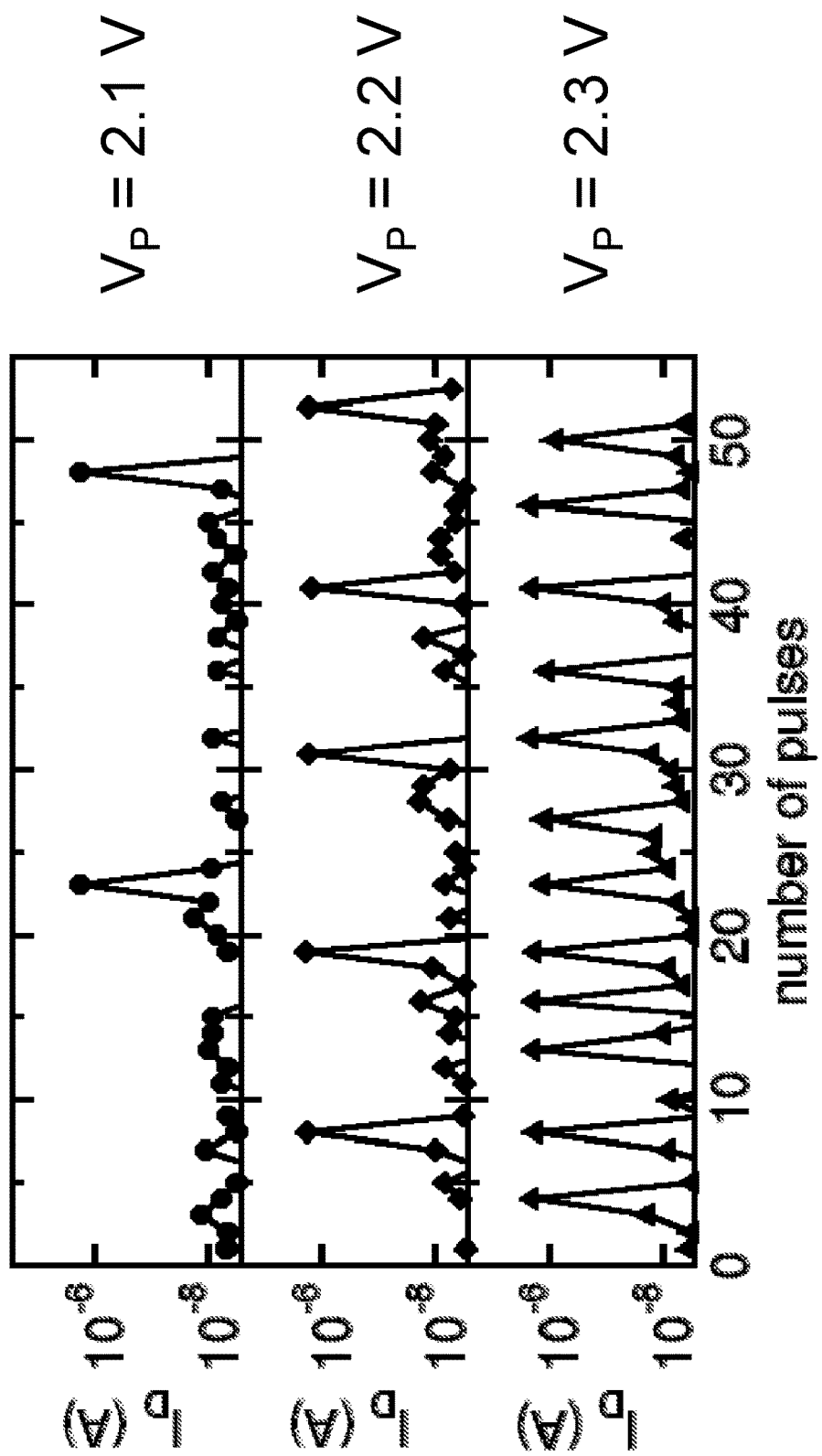
FIG. 8 shows an example of an experimental emulation of the circuital operation described in FIG. 6d achieved by using a single FeFET and repeated integrate-and-fire operations.

FIG. 8 illustrates an example experimental emulation of the circuital operation described in FIG. 6d achieved by using a single FeFET and repeated integrate-and-fire operations. After each firing cycle, the FeFET is set to the high-VT state by applying a negative VN pulse and a new integrate-and-fire cycle is started. The results are obtained for three representative VP amplitudes and for fixed tp=1 us and Δt=100 ns. When comparing the three cases, for higher VP values, a lower NP is necessary to complete an integrate-and-fire cycle. In this way, the firing dynamics of the artificial neuron may be tuned by changing VP.

In other examples, similar tuning of the firing dynamics may be achieved by changing tp, while keeping VP fixed.

In examples, the change of the logic value resulting in a drain current change can be used to reset the logic value, such as, for example, by feeding the change in drain current back to the logic input signal of the gate. In one example, drain current amplification by an amplifier 603, as shown in FIG. 6c, may be employed for this approach.

In other examples, the integrate-and-fire activity may be achieved by starting from the low-VT state and performing the integration of negative pulses until the switching occurs from ION to IOFF. In examples, such operation is ensured by the equivalency of the "up" and "down" polarization states and the equivalency of their respective ferroelectric nucleation. In such case, the FeFET would first be set to the reference low-VT state by a positive VP pulse. Then, a number of negative VN pulses, each of which is insufficient for switching, is accumulated until the switching to the high-VT state takes place, which results in an abrupt decrease of the drain current from ION to IOFF.

It is to be understood that, in examples, integration of negative pulses and the resulting switching to the high-VT state is employed to emulate the integrate and fire neuron in a similar way as described above, with suitable changes to the pulse polarity, pulsing scheme and surrounding circuitry.

Additional variations of the FeFET geometry can impact the integrate-and-fire property. For example, by increasing a thickness of the interface layer 203 of FIGS. 2a and 2b beyond 2 nm, the depolarization field across the ferroelectric will make the device volatile. The inter-arrival time of gate pulses in the accumulative operation mode Δt will then have an impact on the accumulation efficiency such that for longer Δt the accumulation will be less efficient, and a larger number of pulses NP will be necessary for threshold switching. Such feature can be seen as leaky behavior typical for biological neurons (leaky integrate-and-fire neurons) and, in examples, can be employed to tune the firing dynamics of the FeFET based artificial neuron.

The increase of the interface thickness may impair the retention of one or both stored high- and low-VT states. This means that the low-VT state, which is achieved after one complete integrate-and-fire cycle, will spontaneously decay either to the high-VT or some intermediate state. In examples, such property can be employed for self-resetting of the neuron after firing, without an application of external negative pulse and without additional circuitry represented by the block 604 in FIG. 6c or 6d.

In examples, the artificial integrate-and-fire neuron described by the present disclosure refers to adoption of a small-area FeFET (e.g. having channel length and width of 30 nm and 80 nm, respectively), for which the abrupt switching occurs. It is to be understood that present disclosure applied to large-area devices as well, which display a gradual, or at least step-wise, switching from one state to the other. In such case, the accumulation property is a feature may be employed for implementing the neuronal integration. Additional circuitry may, however, be needed for implementing the thresholding function of FIG. 1, which, in one example, may be realized e.g. with a simple comparator placed within the block 604 of FIG. 6c or d.

In examples, the present disclosure describes a polarization-based capacitor structure having one electrode connected to the gate of a transistor and a polarizable material layer having at least two polarization states, the polarization state representing a logic value used for accumulation switching and in specific artificial neurons, as illustrated by FIG. 6b. In one example implementation, the capacitor structure comprises a ferroelectric layer stack. In one example, the layer stack comprises a ferroelectric material that is at least partially in a ferroelectric state. The switching of the electric polarization in the ferroelectric material, achieved by applying an external electric field, can be used as input signal to the gate of the transistor. Moreover, the switching can be accomplished by applying a number of identical pulses, each of which is insufficient for switching (a so-called "accumulation operation mode"). In examples, this accumulation property in the ferroelectric layer stack is used to implement an artificial neuron and is described in greater detail below.

In examples, the ferroelectric material used is at least partially in a ferroelectric state. For example, the ferroelectric material may comprise any of $HfO_2$, $ZrO_2$, any ratio of Hf and Zr combined with oxygen (e.g., $Zr_xHf_{1-x}O_2$, where x<1) as well as any combinations thereof. Further details of the ferroelectric layer stack are described above. It is noted that, in examples, adjustments may be needed for different integrations schemas and different interfaces. It is further understood that the ferroelectric layer stack may comprise a ferroelectric and dielectric layer.

It is further noted that a structure of the polarization-based capacitor may also be formed with any one or more suitable geometries including, without limitation, planar or 3D geometry such as trench capacitors, stacked capacitors or cup-capacitors.

Although specific embodiments have been illustrated and described herein, it will be appreciated by those of ordinary skilled in the art that a variety of alternate and/or equivalent implementations may be substituted for the specific embodiments shown and described without departing from the scope of the present invention. This application is intended to cover any adaptions or variations of the specific embodiments discussed herein. Therefore, it is intended that this invention be limited only by the claims and the equivalents thereof.

What is claimed is:

1. An artificial neuron integrated circuit comprising:
    a polarizable circuit element including:
        a first electrode;
        a second electrode; and
        a polarizable material layer disposed between the first electrode and the second electrodes, the polarizable material layer changeable between a first polarization state and a second polarization state, in response to accumulating an electrical excitation at least equal to a threshold electrical excitation from receiving a series of time-separated voltage pulses across the first electrode and the second electrodes, the polarizable material layer to change from one of the first and second polarization states to the other of the first and second polarization states, where an amount of electrical excitation provided by each individual pulse of the series of voltage pulses is less than the threshold electrical excitation and insufficient to change the polarization state.

2. The integrated circuit of claim 1, the first polarization state representing a first logic value and the second polarization state representing a second logic value, such that a change in polarization state represents a change in logic value.

3. The integrated circuit of claim 1, where a magnitude of each voltage pulse is less than a magnitude of a coercive voltage of the polarizable material layer.

4. The integrated circuit of claim 1, the polarizable circuit element comprising a transistor having a gate, a source, and a drain terminal, the polarizable material layer comprising a gate oxide of the transistor, the first electrode being the gate terminal, and the second electrode being a channel region of the transistor.

5. The integrated circuit of claim 4, the transistor comprising a FeFET.

6. The integrated circuit of claim 1, the polarizable circuit element comprising a capacitor having an anode terminal and a cathode terminal, the first electrode being one of the anode and cathode terminals and the second electrode being the other of the anode and cathode terminals.

7. The integrated circuit of claim 6, further including a transistor having a gate terminal, a source terminal, and a drain terminal, one of the cathode and anode terminals connected to the gate terminal, upon the polarizable material layer of the capacitor changing polarization states, a resulting voltage at the gate terminal turning the transistor to an on-state resulting in an increase in a drain current between the drain terminal and source terminal via the channel region which is indicative of the polarization state change.

8. The integrated circuit of claim 1, wherein the polarizable material layer comprises a ferroelectric material layer.

9. The integrated circuit of claim 1, wherein the polarizable material layer comprises any of $HfO_2$, $ZrO_2$, and ratio of Hf and Zr combined with oxygen (e.g., $Zr_xHf_{1-x}O_2$, where x<1), as well as any combinations thereof.

10. The integrated circuit of claim 1, including a plurality of voltage sources each providing voltage pulses to the first electrode, each voltage source representing a synapse.

11. An artificial neuron integrated circuit comprising:
    a polarizable circuit element including:
        a first electrode;
        a second electrode; and
        a polarizable material layer disposed between the first electrode and the second electrode, the polarizable material layer changeable between a first polarization state and a second polarization state, in response to accumulating an electrical excitation at least equal to a threshold electrical excitation from receiving a series of time-separated voltage pulses across the first electrode and the second electrode, the polarizable material layer to change from one of the first and second polarization states to the other of the first and second polarization states, where an amount of electrical excitation provided by each individual pulse of the series of voltage pulses is less than the threshold electrical excitation and insufficient to change the polarization state, each voltage pulse having a pulse magnitude and a pulse width, wherein a number of voltage pulses to change the polarization state depends on the pulse magnitude and the pulse width of each pulse, the larger the pulse magnitude and the pulse width the fewer the number of voltage pulses to change the polarization state, and the smaller the pulse magnitude and pulse width the greater the number of voltage pulses to change the polarization state.

12. The integrated circuit of claim 11, where each pulse has a same pulse magnitude and a same pulse width.

13. The integrated circuit of claim 11, where different pulses of the number of pulses have different magnitudes and pulse widths.

14. An artificial neuron integrated circuit comprising:
a polarizable circuit element including:
- a first electrode;
- a second electrode; and
- a polarizable material layer disposed between the first electrode and the second electrode, the polarizable material layer changeable between a first polarization state and a second polarization state, in response to accumulating an electrical excitation at least equal to a threshold electrical excitation from receiving a series of time-separated voltage pulses across the first electrode and the second electrode, the polarizable material layer to change from one of the first and second polarization states to the other of the first and second polarization states, where an amount of electrical excitation provided by each individual pulse of the series of voltage pulses is less than the threshold electrical excitation and insufficient to change the polarization state,
- the polarizable circuit element comprising a transistor having a gate, a source, and a drain terminal, the polarizable material layer comprising a gate oxide of the transistor, the first electrode being the gate terminal, and the second electrode being a channel region of the transistor, the drain terminal connected to a voltage source, wherein initially, prior to receiving the number of voltage pulses, the polarizable material is initially in one of the first and second polarization states where the channel region is non-conductive, and upon receiving the number of pulses, the polarization state of the polarizable material changes from the initial one of the first and second polarization states to the other of the first and second polarization states causing the channel region to become conductive and resulting in an increase in a drain current between the drain terminal and the source terminal which is indicative of the polarization state change.

15. The integrated circuit of claim 14, including a feedback circuit to provide a feedback voltage pulse to reset the polarization state to the initial one of the first and second polarization states, such that the transistor is self-resetting.

16. The integrated circuit of claim 15, the transistor including a bulk terminal, the feedback circuit to provide the feedback pulse to the bulk terminal.

17. The integrated circuit of claim 15, the feedback circuit to provide the feedback voltage pulse to the gate terminal.

18. The integrated circuit of claim 17, including an inverter connected between the source terminal and gate terminal, the inverter to invert an output voltage at the source terminal resulting from the drain current and to provide the inverted output voltage to the gate terminal to reset the polarization state of the polarizable material layer from the second polarization state to the initial first polarization state, the inverted output voltage having a magnitude greater than a magnitude of a coercive voltage of the polarizable material layer.

19. The integrated circuit of claim 18, including an amplifier disposed between the source terminal and the inverter.

20. An artificial neuron comprising:
a polarizable material layer changeable between a first polarization state and a second polarization state, the polarizable material layer to change from an initial one of the first and second polarization states to the other of the first and second polarization state in response to accumulating energy from receiving a series of time-separated voltage pulses which is greater than or equal to a threshold energy, where an energy provided by each individual pulse of the series of voltage pulses is less than the threshold energy and is insufficient to change the polarization state.

21. The artificial neuron of claim 20, the accumulative energy represented by an accumulate polarization reversal within the polarization material layer.

22. The artificial neuron of claim 20, including a transistor having a gate terminal, a source terminal, and a drain terminal, the polarizable material layer comprising a gate oxide of the transistor.

23. The artificial neuron of claim 22, the transistor further including a bulk terminal.

24. The artificial neuron of claim 22, the transistor comprising a FeFET.

25. A method of operating an integrated circuit including a polarizable material layer as an artificial neuron, the method including:
applying a series of time-separated voltage pulses across the polarizable material layer to accumulate and electrical excitation in the polarizable material layer, the polarizable material layer to switch a polarization state from an initial one of a first and a second polarization state to the other of the first and second polarization state when the accumulated electrical excitation in the polarizable material layer reaches a threshold electrical excitation, where each individual voltage pulse of the series of voltage pulses delivers an incremental electrical excitation to the polarizable material layer which is less than the threshold electrical excitation such that each individual voltage pulse is insufficient to switch the polarization state.

26. The method of claim 25, where applying the number of voltage pulses includes applying each voltage pulse with a same magnitude and a same pulse width.

27. The method of claim 25, wherein applying the number of voltage pulses includes applying voltage pulses having different magnitudes and different pulse width.

28. The method of claim 25, the integrated circuit device comprising a transistor, where the polarizable material layer comprises a gate oxide layer of the transistor.

29. The method of claim 25, the integrated circuit device comprising a capacitor.

30. The method of claim 25, the number of voltage pulses to switch the polarization state depending on a magnitude and a width of the pulses.

31. The method of claim 25, including:
applying a reset voltage pulse across the polarizable material layer to reset the polarizable material layer to the initial polarization state after application of the number of voltage pulses.

* * * * *